United States Patent
Palmer (10) Patent No.: US 10,957,381 B1
(45) Date of Patent: Mar. 23, 2021

(54) METADATA GROUPING FOR UN-MAP TECHNIQUES

(71) Applicant: Micron Technology, Inc., Boise, ID (US)

(72) Inventor: David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,358

(22) Filed: Aug. 28, 2019

(51) Int. Cl.
| | | |
|---|---|---|
| *G11C 7/10* | (2006.01) | |
| *G11C 11/409* | (2006.01) | |
| *G06F 12/02* | (2006.01) | |
| *G06F 3/06* | (2006.01) | |
| *G06F 13/16* | (2006.01) | |

(52) U.S. Cl.
CPC .......... *G11C 11/409* (2013.01); *G06F 3/0614* (2013.01); *G06F 3/0644* (2013.01); *G06F 3/0679* (2013.01); *G06F 12/0246* (2013.01); *G06F 13/1668* (2013.01); *G06F 2212/7201* (2013.01)

(58) Field of Classification Search
CPC ........ G11C 16/08; G11C 16/107; G11C 16/16
See application file for complete search history.

(56) References Cited

U.S. PATENT DOCUMENTS

| | | | |
|---|---|---|---|
| 8,873,284 B2* | 10/2014 | Sinclair | G06F 12/0246 365/185.03 |
| 2006/0052962 A1* | 3/2006 | Shipton | H04N 1/405 702/106 |
| 2014/0189209 A1* | 7/2014 | Sinclair | G06F 3/0688 711/103 |
| 2018/0095670 A1* | 4/2018 | Davis | G11C 7/1072 |
| 2019/0074283 A1* | 3/2019 | Amaki | G11C 16/16 |

* cited by examiner

*Primary Examiner* — Tuan T Nguyen
(74) *Attorney, Agent, or Firm* — Schwegman Lundberg & Woessner, P.A.

(57) ABSTRACT

Devices and techniques are disclosed herein to address high latency associated with large-scale un-map or trim commands associated with flash memory. In an example, a method can include receiving a trim command for a partition of a storage system, identifying a record of a partition table of the storage system corresponding to the partition, updating a partition count of the record with a count value of a partition counter of the storage system, and incrementing the partition counter.

27 Claims, 7 Drawing Sheets

METADATA GROUPING FOR UN-MAP TECHNIQUES

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a storage system, such as a solid-state drive (SSD), a Universal Flash Storage (UFS™) device, a MultiMediaCard (MMC) solid-state storage device, an embedded MMC device (eMMC™), etc.

A storage system can include one or more processors or other memory controllers performing logic functions to operate the memory devices or interface with external systems. The memory matrices or arrays can include a number of blocks of memory cells organized into a number of physical pages. The storage system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MIVIC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Flash memory-based storage devices such as NAND memory can use a Flash Translation Layer (FTL) to translate logical addresses of I/O requests, often referred to as logical block addresses (LBAs), to corresponding flash memory addresses which are stored in one or more FTL mapping tables. LBAs can be the logical addresses used by a host for managing data. Mobile storage devices typically have a cache with constrained size, and thus often lack memory to store an entire mapping table. Therefore, portions of the mapping table(s) can be retrieved from the flash memory on demand, which can cause random read performance degradation.

Storage devices can track and mange host data via the host logical block address (LBA) and storage device physical block address (PBA). FTL tables are sometimes referred to a logical-to-physical (L2P) tables that can be maintained and map Host LBAs to a storage device PBA so that the controller of the storage device is able to locate each LBA within the memory storage media. Particularly in mobile or IOT applications, the L2P table can be too large to store in controller memory and so it is stored in the physical media array.

An un-map, trim, or erase command can be used by a host to signal that a range of memory can be deleted and reclaimed. For devices that have a cache of limited size, implementation of an un-map, trim or erase command can require potentially large portions of L2P table to be modified. Such modification processes can include repeated loads of portions of each L2P table into the cache from non-volatile memory, updates of the relevant LBA's as unmapped in the cache, and transfers of the cache back to non-volatile memory. For deletions of an entire region of a storage device, such as an entire partition, an entire logical unit (LU), or some other sized space of the storage device, or all the logical address space of the storage device, execution of such a command can take tens of seconds or longer to fully execute. A conventional implementation simply blocks all other host commands from executing during execution of an un-map command, but results in very poor user experience as the device is non-responsive during the processing.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As discussed above, flash memory-based storage devices or systems such as NAND memory can use a Flash Translation Layer (FTL) to translate logical addresses of I/O requests, often referred to as logical block addresses (LBAs), to corresponding flash memory addresses which are stored in one or more FTL mapping tables. LBAs can be the logical addresses used by a host for managing data. Mobile storage devices typically have a cache with constrained size, and thus often lack memory to store an entire mapping table. Accessing memory for the purpose of reclaiming or erasing a portion of the memory can involve repeated retrieval of portions of mapping table(s) which can result in performance degradation of the device and poor user experiences.

The present inventors have recognized techniques to address high latency associated with large-scale un-map commands, particularly in mobile and IoT storage systems. In certain examples, techniques of the present subject matter can reduce the latency of such large scale un-map commands to the latency of a single write operation of the storage system.

Figure 1:
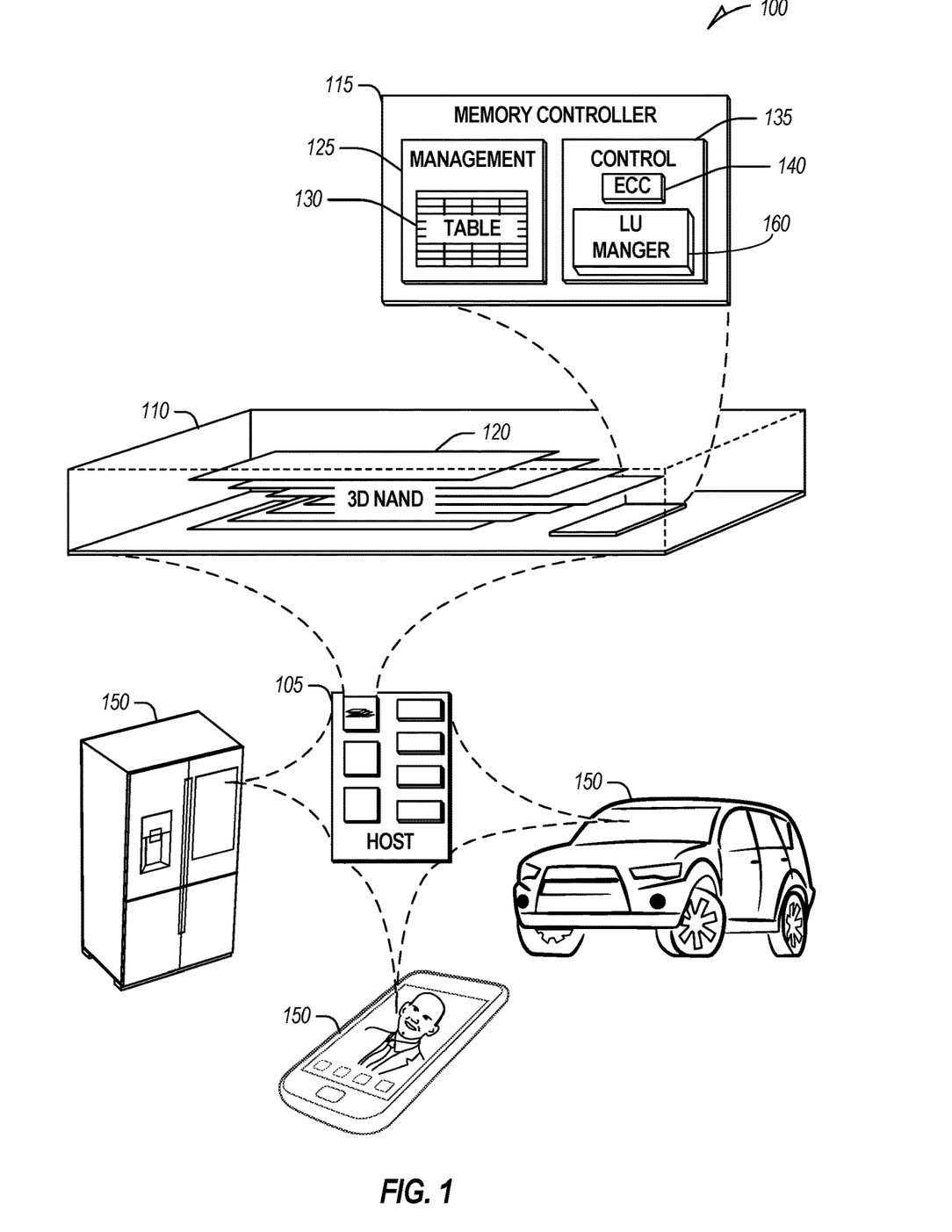
FIG. 1 illustrates an example system an environment including a memory device upon which one or more examples of the present subject matter may be implemented.

FIG. 1 illustrates an example of an environment 100 including a host device 105 and a managed memory device 110 configured to communicate with each other over a communication interface. Thus, as described herein, actions ascribed to the host device 105 are external to those of the managed memory device 110, even when, as illustrated, the managed memory device 110 is a package within the host device 105. Thus, in some examples, the managed memory device 110 can be included as part of the host 105 (as depicted in FIG. 1) or the managed memory device 110 can be a separate component external to the host device 105. The host device 105 or the managed memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

Figure 5:
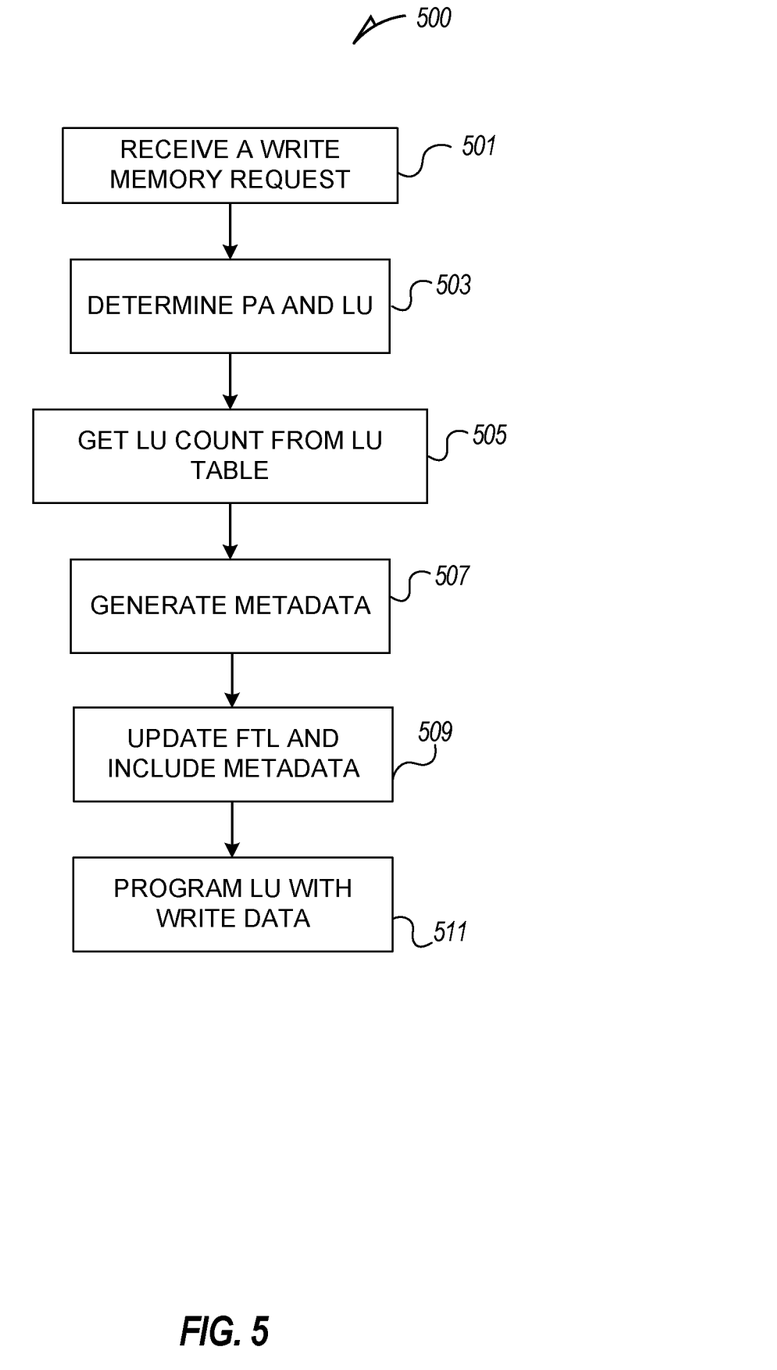
FIG. 5 illustrates generally an example method for a write memory request.

The managed memory device 110 includes a memory controller 115 and a memory array 120 including, for example, a number of individual memory devices (e.g., each memory device being a stack of three-dimensional (3D) NAND die). Thus, the managed memory device 110 includes the memory controller 115 and one or more memory devices—an example of a memory device is illustrated in FIG. 5. In examples without the managed memory device 110, the memory controller 115, or its equivalent, will be part of the host device 105 and external to the package of the memory device or devices that comprise the memory array 120. In 3D architecture semiconductor memory technology, vertical structures are stacked, increasing the number of tiers, physical pages, and accordingly, the density of a given memory device (e.g., a storage device).

In an example, the managed memory device 110 can be a discrete memory or storage device component of the host device 105. In other examples, the managed memory device 110 can be a portion of an integrated circuit (e.g., system on a chip (SOC), etc.), stacked or otherwise included with one or more other components of the host device 105.

One or more communication interfaces can be used to transfer data between the managed memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, control circuitry, or a memory card reader. In some examples, the host device 105 can be a machine having some portion, or all, of the components discussed in reference to the machine 700 of FIG. 7. Data can be transferred between the managed memory device 110 and other components over an I/O bus.

The memory controller 115 can receive instructions from processing circuitry (e.g., a processor) of the host device 105, and can communicate with the memory array 120, such as to transfer data to (e.g., write or erase) or from (e.g., read) one or more of the memory devices and associated memory cells, planes, sub-blocks, blocks, or pages of the memory array 120. The memory controller 115 can include, among other things, circuitry or firmware, including one or more components or integrated circuits. For example, the memory controller 115 can include one or more circuits, control circuitry, or components configured to control access across the memory array 120 and to provide a translation layer between the host device 105 and the memory devices of the memory array 120. The memory controller 115 can include one or more input/output (I/O) circuits, lines, or interfaces to transfer data to or from the memory array 120. The memory controller 115 can include a memory manager 125 and an array controller 135.

The array controller 135 can include, among other things, circuitry or components configured to control memory operations associated with writing data to, reading data from, or erasing one or more memory cells of the memory devices in the memory array 120. The memory operations can be based on, for example, host commands received from processing circuitry of the host device 105, or internally generated by the memory manager 125 (e.g., in association with wear leveling, error detection or correction, etc.).

In operation, data is typically written to or read from the NAND managed memory device 110 in pages and erased in blocks. However, one or more memory operations (e.g., read, write, erase, etc.) can be performed on larger or smaller groups of memory cells, such as partitions, LBA regions, or host-defined logical units (LUs), as desired. The data transfer size of a NAND managed memory device 110 is typically referred to as a page, whereas the data transfer size of a host is typically referred to as a sector.

The array controller 135 can include an error correction code (ECC) component 140, which can include, among other things, an ECC engine or other circuitry configured to detect or correct errors associated with writing data to or reading data from one or more memory cells of the memory devices coupled to the memory controller 115. ECC component 140, for example, can detect or compute a bit-error-rate (BER) associated with performing a number of memory operations. The BER can correspond to bit errors occurring in latches of an I/O bus, internal errors of controller 115, errors occurring in one or more of the memory devices of the managed memory device 110. The memory controller 115 can be configured to actively detect and recover from error occurrences (e.g., bit errors, operation errors, etc.) associated with various operations or storage of data, while maintaining integrity of the data transferred between a processor of the host device 105 and the managed memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. In an example, some of these operations, such as detecting a read fault, can be implemented in a memory control unit of each memory device in the memory array 120.

In certain examples, the controller 115 can include a partition, LBA region, or logical unit (LU) manager 160 used to effect un-mapping large portions of memory in accordance with embodiments described herein including the use of an up-counter and LU table as discussed below. However, the controller 115 can include various other components not illustrated so as not to obscure embodiments of the present disclosure. Also, although LU manager 160 is illustrated as resident on the controller 115, in some embodiments, the LU manager 160 may reside elsewhere in the memory device 110 (e.g., as an independent component or resident on a different component of the system). The LU manager 160 can be implemented in hardware and/or firmware, for example, and can reduce execution latency of an erase, un-map, or trim command to as little as the interval to execute a single write operation.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection (e.g., bit-error-rate (BER) monitoring) or correction, block retirement, or one or more other memory management functions. The memory manager 125 can parse or format host commands (e.g., commands received from processing circuitry of host device 105) into device commands (e.g., commands associated with operation of a memory array, etc.), or generate device commands (e.g., to accomplish various memory management functions) for the array controller 135 or one or more other components of the managed memory device 110. In an example, some of these operations can be implemented in a memory control unit of each memory device in the memory array 120.

The memory manager 125 can include a set of management tables 130 configured to maintain various information associated with one or more components of the managed memory device 110 (e.g., various information associated with a memory array or one or more memory cells coupled to the memory controller 115). For example, the management tables 130 can include information regarding block age, block erase count, error history, error parameter information, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts (e.g., an error parameter) is above a threshold (e.g., an allowable error threshold), the bit error can be referred to as an uncorrectable bit error. The management tables 130 can maintain a count of correctable or uncorrectable bit errors, among other things.

As noted above, the memory array 120 can include one or more memory devices. The individual memory devices can include several memory cells arranged in, for example, a number of logical devices or logical units (LU), planes, sub-blocks, blocks, or pages. As one example, a 48 GB TLC NAND memory device can include 18,592 bytes of data per page (16,384+2208 bytes), 1536 pages per block, 548 blocks per plane, and four or more planes per device. As another example, a 32 GB MLC memory device (storing two bits of data per cell (i.e., four programmable states)) can include 18,592 bytes of data per page (16,384+2208 bytes), 1024 pages per block, 548 blocks per plane, and four planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

Different types of memory devices can provide for different page sizes or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash memory device can have a higher bit error rate than a corresponding single-level cell (SLC) NAND flash memory device. As such, the MLC device can require more metadata bytes for error data than the corresponding SLC device.

Figure 2:
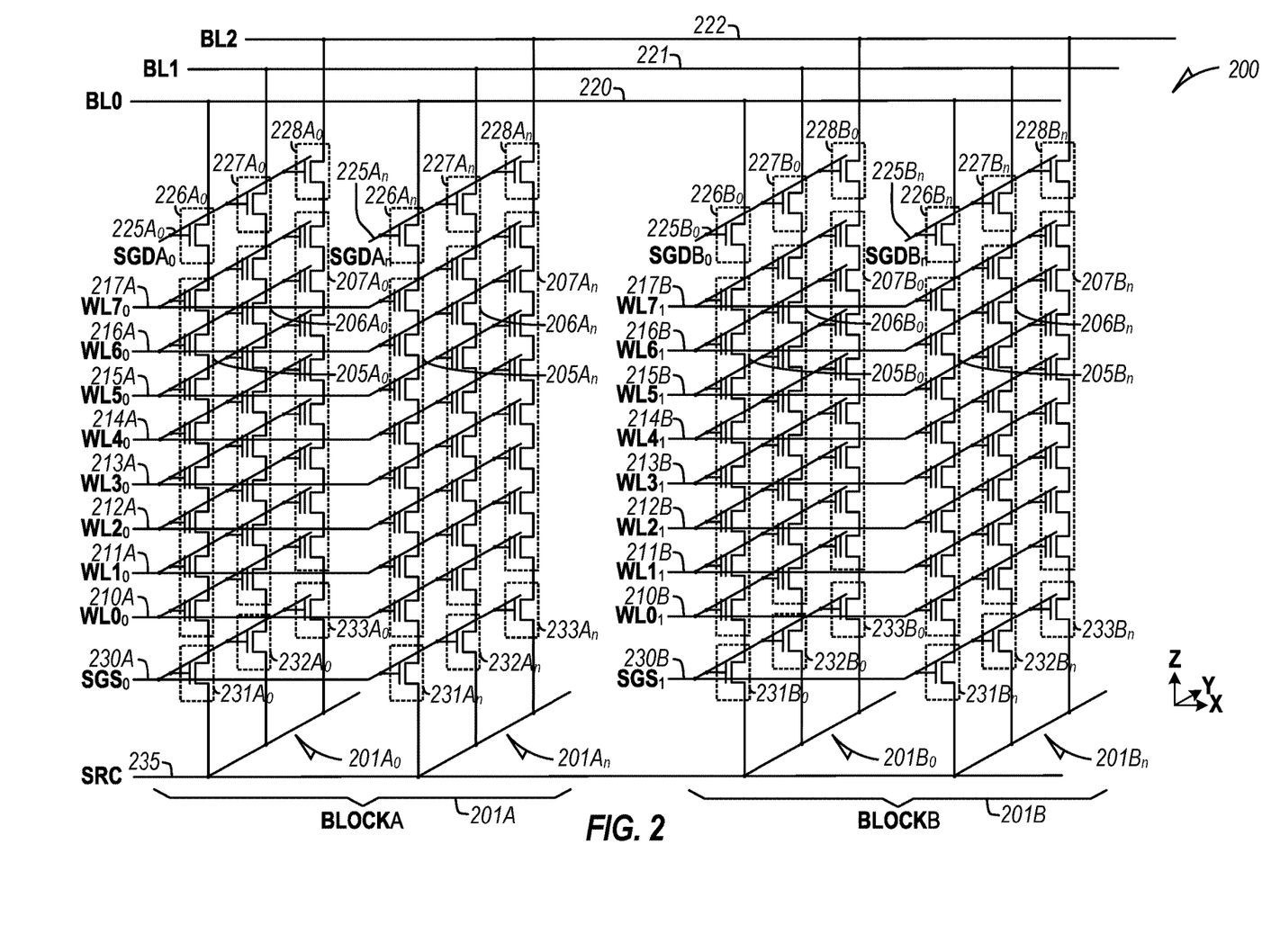
FIG. 2 illustrates an example schematic diagram of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures than would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 284, etc.). The illustrated memory device provided for purposes of description includes two blocks, each block having two sub-blocks, each sub-block having a single physical page, with each physical page having three strings of memory cells, and each string having 8 tiers of memory cells. In actual devices, the memory array 200 will typically include a much greater number of blocks, sub-blocks, physical pages, strings of memory cells, memory cells, and/or tiers. For example, each string of memory cells can include a selected number of tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array 200, and accordingly, specific memory cells in a string, can be accessed or controlled using respective access lines. Groups of select gates can be accessed using various select lines. For example, first-third $A_0$ SGD 226$A_0$-228$A_0$ can be accessed using an $A_0$ SGD line SGDA$_0$ 225$A_0$, first-third $A_n$ SGD 226$A_n$-228$A_n$ can be accessed using an SGD line SGDA$_n$ 225$A_n$, first-third $B_0$ SGD 226$B_0$-228$B_0$ can be accessed using an $B_0$ SGD line SGDB$_0$ 225$B_0$, and first-third $B_n$ SGD 226$B_n$-228$B_n$ can be accessed using a $B_n$ SGD line SGDB$_n$ 225$B_n$. First-third $A_0$ SGS 231$A_0$-233$A_0$ and first-third $A_n$ SGS 231$A_n$-233$A_n$ can be accessed using a gate select line SGS$_0$ 230A, and first-third $B_0$ SGS 231$B_0$-233$B_0$ and first-third $B_n$ SGS 231$B_n$-233$B_n$ can be accessed using a gate select line SGS$_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
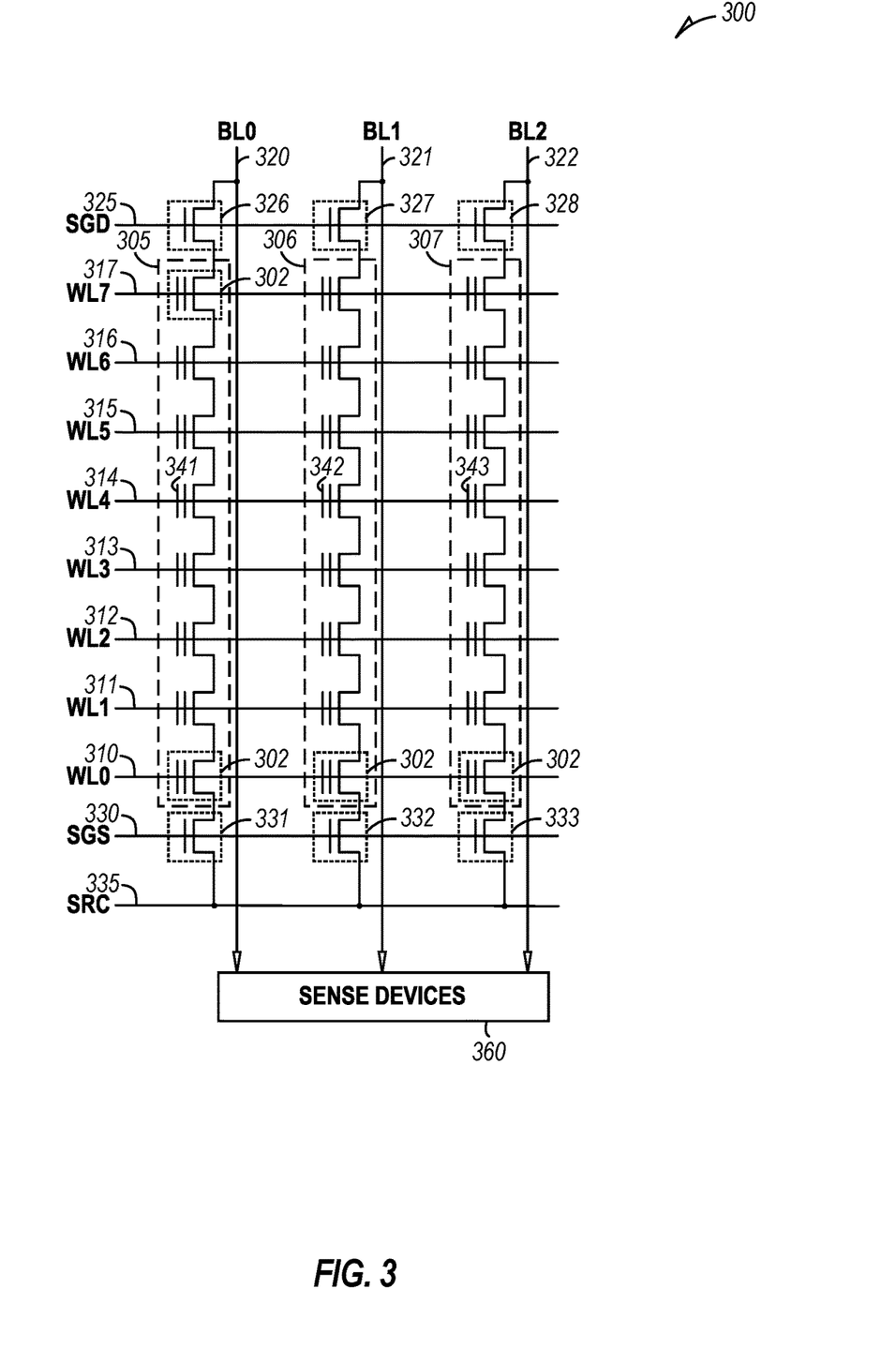
FIG. 3 illustrates an example schematic diagram of a portion of a NAND architecture semiconductor memory array.

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and devices or sense amplifiers 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell 302 in respective data lines by sensing a voltage or current on a particular data line. Sense amplifiers 360 can determine whether a state of a given memory cell 302 or set of cells is unstable. In such circumstances, sense amplifiers 360 can record this instability as an error parameter. Sense amplifiers 360 can communicate with a controller to correct the error parameter.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

To read data from a given page of memory cells, a read threshold voltage or potential (Vt) is applied to the word lines and the voltage is sensed from the corresponding data lines. If a given cell is programmed, application of the Vt (or voltage within a range of Vt), can result in a given voltage level (within a programmed range) being sensed at the corresponding bit line. If the voltage level that is sensed is within the acceptable programmed range, a bit value of '0' can be determined to be stored in the given cell. If the given cell is not programmed, application of the Vt (or voltage within a range of Vt), can result in a given voltage level (within an erased range) being sensed at the corresponding bit line. If the voltage level that is sensed is within the acceptable erased range, a bit value of '1' can be determined to be stored in the given cell.

In addition to managing one or more of the above described functions for a managed NAND memory device, the memory controller may need to also manage power usage of the multiple NAND die of the memory device to provide a balance between the user experience, sometimes known as performance, and length of the interval between required battery charging events. As discussed above, to provide the best possible user experience for a mobile device, it would be logical to maintain full power to each memory die of each memory device of the mobile device. However, in doing so, a user may need to recharge the battery of the mobile device quite often. The present inventor(s) have recognized techniques to indicate erased areas of managed NAND memory in as little time as it takes to execute a single write command.

Figure 4:
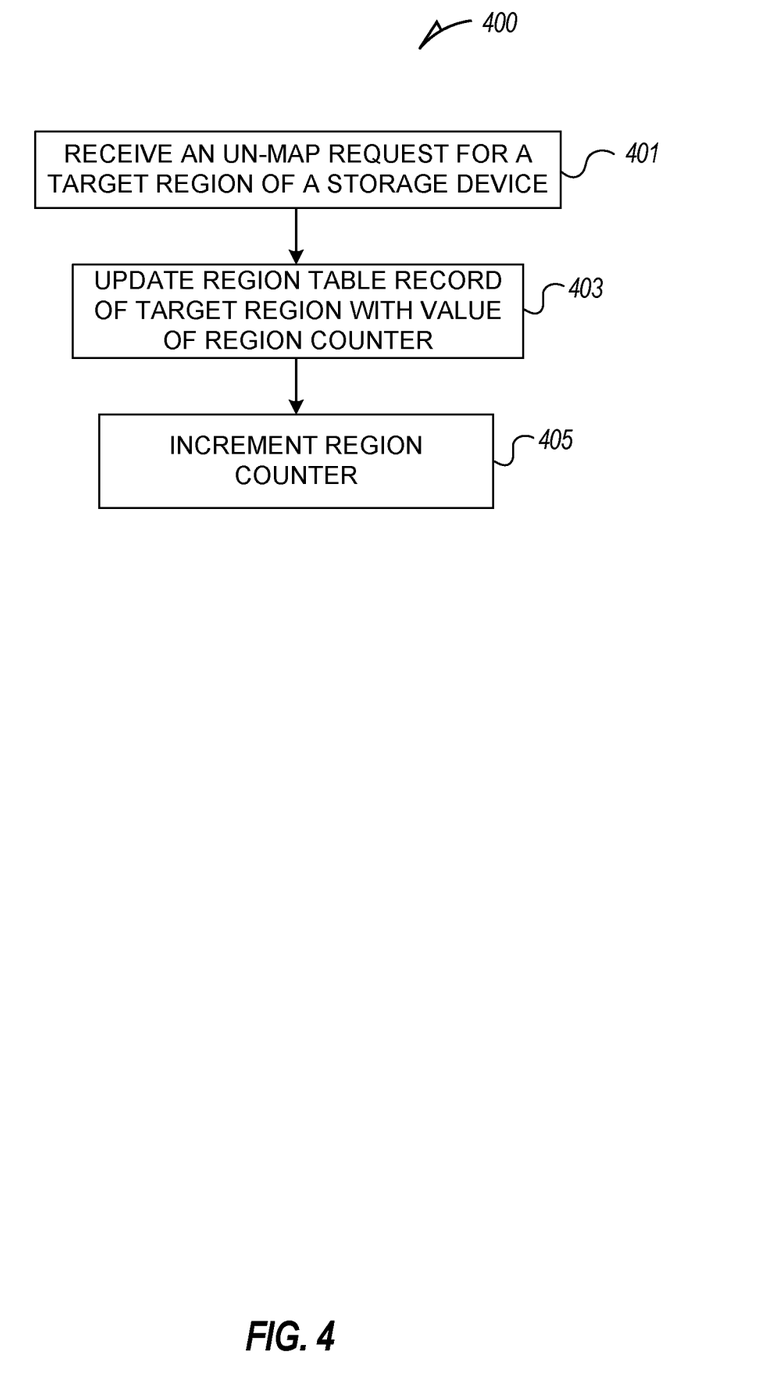
FIG. 4 illustrates generally a flow chart of an example method for un-mapping or trimming LBA region according to the present subject matter.

FIG. 4 illustrates generally a flow chart of an example method 400 for un-mapping or trimming a LBA region, such as a LU, according to the present subject matter. In some examples, the un-map or trim command can be initiated by the memory controller alone or by the memory controller in response to a host command. At 401, the memory controller can receive an un-map or trim command for a target region of the storage system or of an LBA region of the host. At 403, the current count of the region record of the region table associated with the target region can be updated with the value of the region counter. At 405, the region counter can be incremented. In certain examples, the region table, or the LU table, for example, can be stored in highly reliable persistent storage such as single-level-cell (SLC), for power safe operation.

With this mechanism, the execution time of a full LU or full region, or whole device un-map operation can be limited to the latency of a write, such as the latency of a single SLC write (for NAND based storage such latency can be well below 1 ms), which offers a significant improvement in the user experience. The 'real' un-map operation can be deferred to later background garbage collection or wear-leveling time. In certain examples, invalid data during garbage collection can be verified by comparing the target region count, or LU count, as the case may be, included with metadata associated with a physical address in FTL with the region, or LU, count associated with the region or LU in the region, or LU, table.

Implementation of such an efficient un-map or trim process can be a simple counter check on host data reads and the addition of a small number of bytes to store the region or LU counter. In certain examples for LU, but not so limited, a 2 byte counter can allow for 16,384 LU provisioning/un-map events or more if counter rollover is allowed. A 4-byte counter would allow for over a billion provisioning/un-map events which would be equivalent to 27 events per second over a five-year lifetime. In certain examples, the storage system does not include a mechanism to decrement the LU counter. After an LU un-map event, un-mapping operations via the FTL can proceed in the background or can be accomplished during garbage collection during idle time of the storage system, such as between intervals of servicing requests from a host. Memory to be reclaimed can be recognized when the LU count within the metadata associated with a LBA does not match the current count of the LU within the LU table.

FIG. 5. illustrates generally an example method for a write memory request. At 501, a memory write request can be received at the memory controller. In some examples, the memory write command can be initiated by the memory controller alone or by the memory controller in response to a host command. The memory write request can include an LBA, especially if the memory write command is initiated in response to a host request. At 503, a physical address (PA) and LU can be associated with LBA. In certain examples, an FTL can assist in determining the PA. At 505, an LU table stored in highly reliable persistent storage such as single-level-cell (SLC can provide an LU count associated with the LU. At 507, metadata associated with the LBA can be generated to include the LU count. At 509, The LBA, PA and metadata can be stored with the FTL table. At 511, memory cells of the LU associated with the PA can be programmed with the write data. In certain examples, the metadata associated with the LU count can be programmed with the write data at the PA instead of with the FTL table. Itis understood that although FIGS. 5 and 6 discuss LUs as a region, different methods of petitioning the storage device or the LBA address space of the storage device are possible without departing from the scope of the present subject matter.

Figure 6:
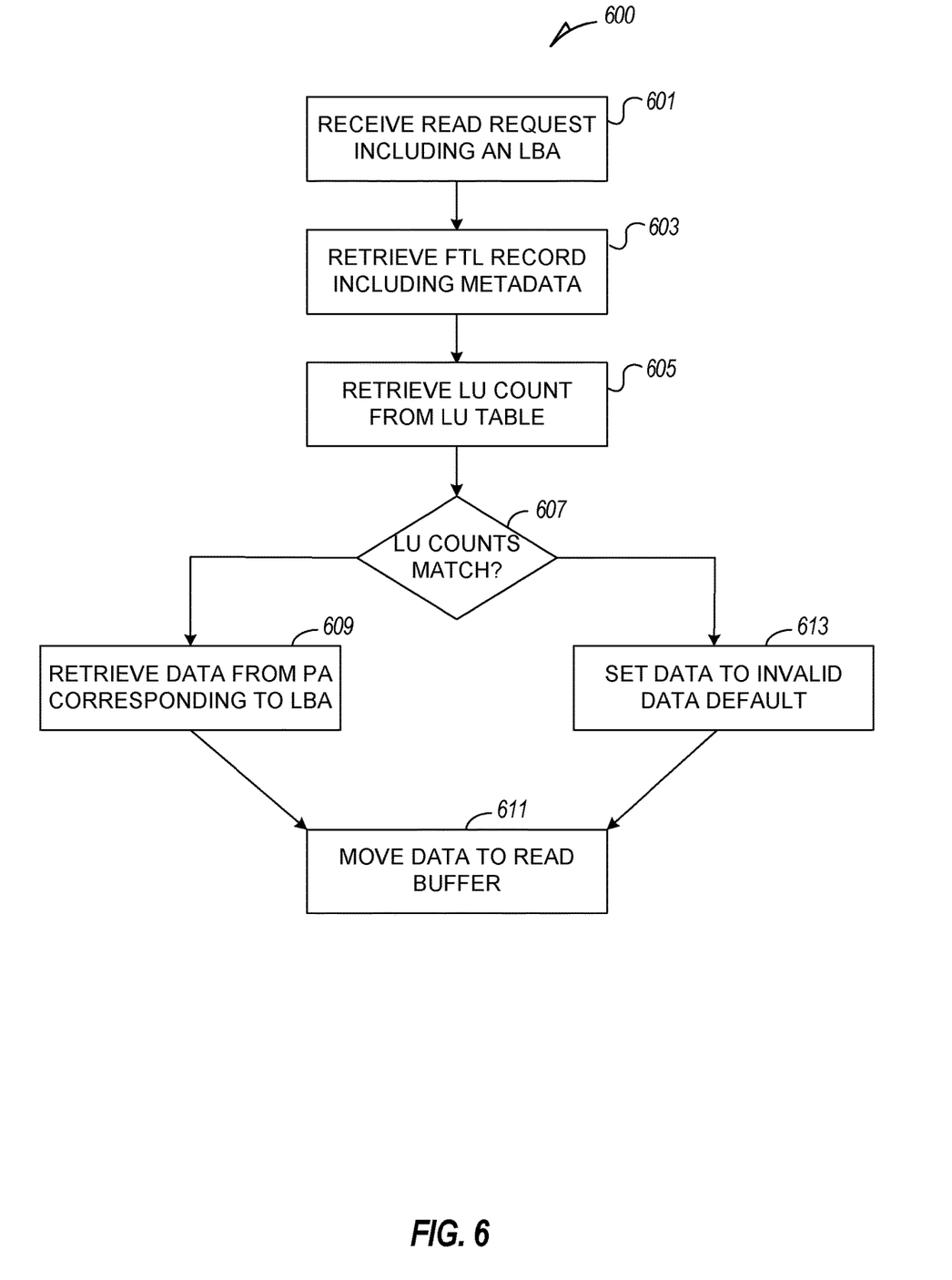
FIG. 6 illustrates generally an example method for executing a read request according to the present subject matter.

FIG. 6 illustrates generally an example method 600 for executing a read request according to the present subject matter. In certain examples, the read request can be initiated internally at the storage device or in response to a host request. At 603, a read request can be received. The read request can be initiated by the memory controller alone or by the memory controller in response to a request from the host. The read request can include an LBA of the host. At 603, a record of the FTL can located. The record can correspond to an LBA of the read request or a physical address of the read request. In some examples, the FTL record can include metadata comprising a LU count and, optionally, an indication of a particular LU of the storage device when the storage device includes more than one LU. In some examples, the FTL record does not include the metadata associated with the LU count. At 605, a record of the LU table can be located that corresponds to the particular LU. The record of the LU table can include a current count associated with the particular LU. At 607, the current count from the LU table can be compared to the LU count of the FTL record. At 609, if the current count matches the LU count, the data at the PA is sensed and, at 611, transferred to a read buffer for retrieval by the host or the storage system controller. If the current count does not match the LU count, the memory location has been unmapped and the data is not valid. Therefore, at 613, if the current count does not match the LU count, data values indicating invalid, unmapped or erased data can be set, such as all zeros, and at 611 can be transferred to the read buffer for retrieval by the host or the storage system controller.

Figure 7:
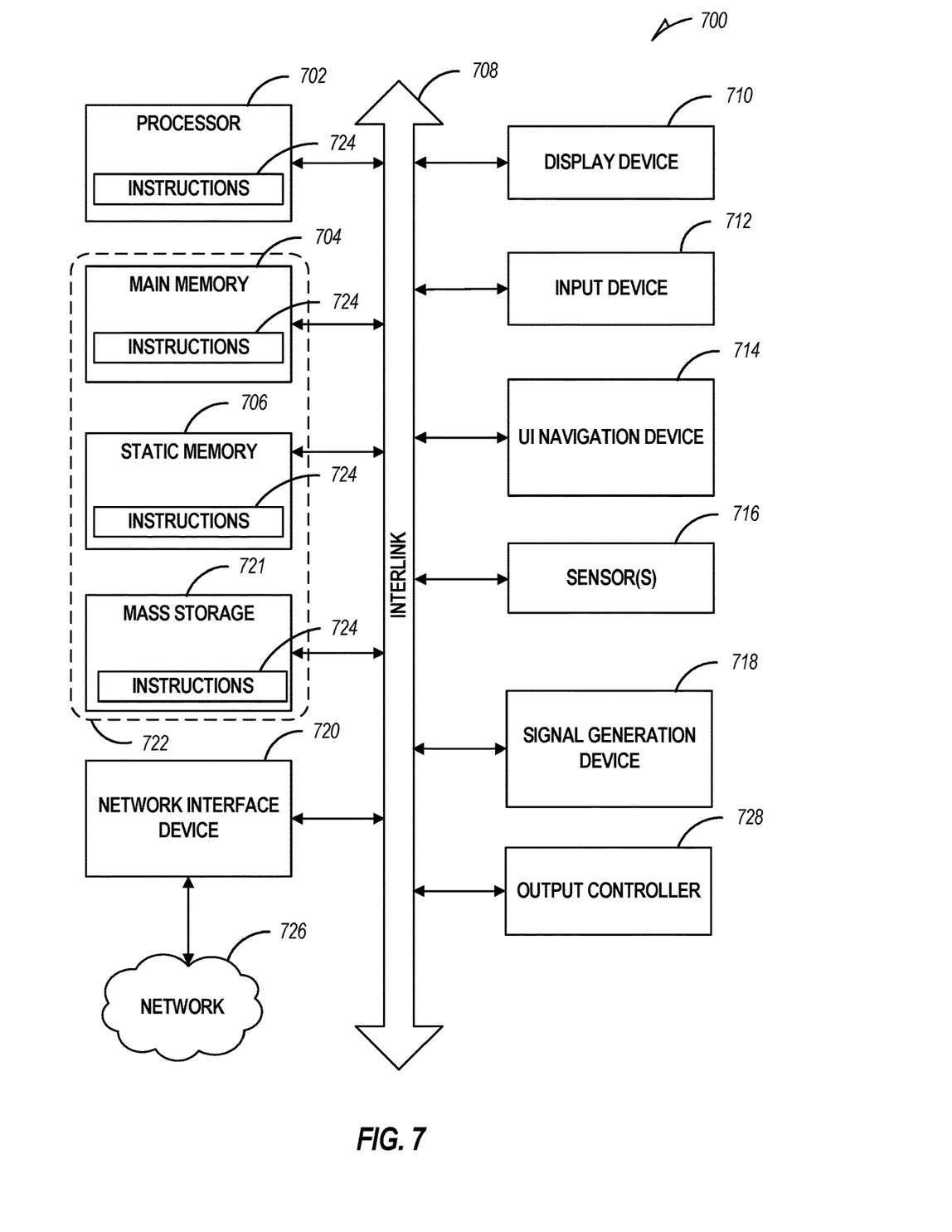
FIG. 7 illustrates a block diagram of an example machine upon which any one or more of the techniques (e.g., methodologies) discussed herein may perform.

FIG. 7 illustrates a block diagram of an example machine 700 upon which any one or more of the techniques (e.g., methodologies) discussed herein may perform. In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 700 (e.g., the host 105, the memory device 110, etc.) may include a processing device 702 (e.g., a hardware processor, a central processing unit (CPU), a graphics processing unit (GPU), a hardware processor core, or any combination thereof, such as a memory controller of the memory device 110, etc.), a main memory 704 (e.g., read-only memory (ROM), flash memory, dynamic random-access memory (DRAM) such as synchronous DRAM (SDRAM) or Rambus DRAM (RDRAM), etc.), a static memory 706 (e.g., flash memory, static random-access memory (SRAM), etc.), and a data storage system 718, some or all of which may communicate with each other via an interlink (e.g., bus) 730.

The processing device 702 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 can be configured to execute instructions 726 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 or within the processing device 702 during execution thereof by the computer system 700, the main memory 704 and the processing device 702 also constituting machine-readable storage media. The machine-readable storage medium 724, the data storage system 718, or the main memory 704 can correspond to the memory device 110 of FIG. 1.

In one implementation, the instructions 726 include instructions to implement functionality corresponding to one or more host-resident FTL operations discussed above with respect to FIG. 2 or FIG. 3. While the machine-readable storage medium 724 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 700 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 700 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 726 (e.g., software, programs, an operating system (OS), etc.) or other data are stored on the data storage device 718 can be accessed by the main memory 704 for use by the processing device 702. The main memory 704 (e.g., DRAM) is typically fast, but volatile, and thus a different type of storage than the data storage device 718 (e.g., an SSD), which is suitable for long-term storage, including while in an "off" condition. The instructions 726 or data in use by a user or the machine 700 are typically loaded in the main memory 704 for use by the processing device 702. When the main memory 704 is full, virtual space from the data storage device 718 can be allocated to supplement the main memory 704; however, because the data storage device 718 device is typically slower than the main memory 704, and write speeds are typically at least twice as slow as read speeds, use of virtual memory can greatly reduce user experience due to storage device latency (in contrast to the main memory 704, e.g., DRAM). Further, use of the data storage device 718 for virtual memory can greatly reduce the usable lifespan of the data storage device 718.

In contrast to virtual memory, virtual memory compression (e.g., the Linux™ kernel feature "ZRAM") uses part of the memory as compressed block storage to avoid paging to the data storage device 718. Paging takes place in the compressed block until it is necessary to write such data to the data storage device 718. Virtual memory compression increases the usable size of the main memory 704, while reducing wear on the data storage device 718.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 724 may further be transmitted or received over a network 720 using a transmission medium via the network interface device 708 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 708 may include one or more physical jacks (e.g., Ethernet, coaxial, or phone jacks) or one or more antennas to connect to the network 720. In an example, the network interface device 708 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 700, and includes digital or analog communications signals or other intangible medium to facilitate communication of such software.

ADDITIONAL NOTES AND EXAMPLES

Example 1 is a method comprising: receiving a trim command for a partition of a flash storage system; identifying a record of a partition table of the storage system corresponding to the partition; updating a partition count of the record with a count value of a partition counter of the flash storage system; and incrementing the partition counter.

In Example 2, the subject matter of Example 1 includes, wherein identifying the record includes retrieving the record from a single-level-cell (SLC) memory of the storage system.

In Example 3, the subject matter of Examples 1-2 includes, wherein updating a partition count of the record with a count value of a partition counter of the flash storage system includes writing the partition table to the SLC memory after incrementing the partition counter; and wherein incrementing the partition counter includes storing a value of the partition counter in the SLC memory.

In Example 4, the subject matter of Examples 1-3 includes, receiving a write command at a controller of the storage system, the write command including a logical block address (LBA) and write data; identifying a physical address (PA) corresponding to the LBA using at least a portion of a logical-to-physical (L2P) table and the LBA; identifying a partition associated with the PA and a partition count associated with the partition using the partition table; generating metadata including the partition count; storing the metadata; and writing the write data at the PA of the flash storage system.

In Example 5, the subject matter of Example 4 includes, wherein storing the metadata and writing the write data includes storing the metadata with the write data.

In Example 6, the subject matter of Examples 4-5 includes, wherein storing the metadata include storing the metadata in the L2P table.

In Example 7, the subject matter of Examples 1-6 includes, receiving a read command at a controller of the storage system, the read command including a logical block address (LBA); identifying a physical address (PA) corresponding to the LBA using at least a portion of a logical-to-physical (L2P) table and the LBA; reading data from the storage system using the PA; identifying a target partition count associated with the data; identifying a partition count associated with the partition using the partition table; comparing the partition count with the target partition count; when the partition count does not match the target partition count, setting read data to a default value indicative of invalid data; and providing the read data in response to the read command.

In Example 8, the subject matter of Example 7 includes, when the partition count matches the target partition count; and providing the read data in response to the read command.

In Example 9, the subject matter of Examples 1-8 includes, conducting garbage collection of the partition during idle times of the storage system after incrementing the partition counter.

Example 10 is a storage system comprising: flash memory; and a controller configured to: receive a trim command for a partition of a flash storage system; identify a record of a partition table of the storage system corresponding to the partition; update a partition count of the record with a count value of a partition counter of the storage system; and increment the partition counter.

In Example 11, the subject matter of Example 10 includes, wherein the controller, when identifying the record of the partition table, is configured to retrieve the record from single-level-cell (SLC) memory of the storage system.

In Example 12, the subject matter of Examples 10-11 includes, wherein the controller is configured to write the record to the SLC memory after incrementing the partition counter.

In Example 13, the subject matter of Examples 10-12 includes, wherein the controller is configured to: receive a write command, the write command including a logical block address (LBA) and write data; identify a physical address (PA) corresponding to the LBA using at least a portion of a logical-to-physical (L2P) table and the LBA; identify a partition associated with the PA; identify a partition count associated with the partition using the partition table; generate metadata including the partition count; store the metadata; and write the write data to the flash memory indexed by PA.

In Example 14, the subject matter of Example 13 includes, wherein the controller is configured to store the metadata in the L2P table.

In Example 15, the subject matter of Examples 13-14 includes, wherein the controller is configured to store the metadata to the flash memory indexed by the PA with the write data.

In Example 16, the subject matter of Examples 10-15 includes, wherein the controller is configured to: receive a read command, the read command including a logical block address (LBA); identify a physical address (PA) corresponding to the LBA using at least a portion of a logical-to-physical (L2P) table of the storage system and the LBA; identify metadata including a target partition count associated with the PA; identify a partition associated with the PA using the metadata; identify a partition count associated with the partition using the partition table; compare the partition count with the target partition count; when the partition count does not match the target partition count, set read data to a default value indicative of invalid data; and provide the read data in response to the read command.

In Example 17, the subject matter of Example 16 includes, wherein the controller is configured to sense the read data from the flash memory indexed by the PA to identify the metadata.

In Example 18, the subject matter of Examples 16-17 includes, wherein, when the partition count matches the target partition count, the controller is configured to provide the read data in response to the read command.

In Example 19, the subject matter of Examples 10-18 includes, wherein the controller is configured to conduct garbage collection of the partition during idle times of the storage system after incrementing the partition counter.

Example 20 is a machine-readable medium including instructions for un-mapping logical units of flash memory, the instructions, when executed by processing circuitry, cause the processing circuitry to perform operations comprising: receiving a trim command for a LBA region of a flash storage system; identifying a record of a LBA region table of the storage system corresponding to the LBA region; updating a LBA region count of the record with a count value of a LBA region counter of the storage system; and incrementing the LBA region counter.

In Example 21, the subject matter of Example 20 includes, wherein, when identifying the record of the LBA region table, the operations include retrieving the record from single-level-cell (SLC) memory of the storage system.

In Example 22, the subject matter of Examples 20-21 includes, wherein the instructions include writing the record to the SLC memory after incrementing the LBA region counter.

In Example 23, the subject matter of Examples 20-22 includes, wherein the instructions further comprise: receiving a write command at a controller of the storage system, the write command including a logical block address (LBA) and write data; identifying a physical address (PA) corresponding to the LBA using at least a portion of a logical-to-physical (L2P) table and the LBA; and identifying a LBA region associated with the PA and a LBA region count associated with the LBA region using the LBA region table.

In Example 24, the subject matter of Examples 20-23 includes, wherein the instructions further comprise: receiving a read command at a controller of the storage system, the read command including a logical block address (LBA); identifying a physical address (PA) corresponding to the LBA using at least a portion of a logical-to-physical (L2P) table and the LBA; reading data from the storage system using the PA; identifying a target LBA region count associated with the data; identifying a LBA region count associated with the LBA region using the LBA region table; comparing the LBA region count with the target LBA region count; when the LBA region count does not match the target LBA region count, setting read data to a default value indicative of invalid data; and providing the read data in response to the read command.

In Example 25, the subject matter of Example 24 includes, wherein the operations further comprise: when the LBA region count matches the target LBA region count, sensing read data from the PA; and providing the read data in response to the read command.

In Example 26, the subject matter of Examples 20-25 includes, wherein the operations further comprise conducting garbage collection of the LBA region during idle times of the storage system after incrementing the LBA region counter.

In Example 27, the subject matter of Examples 20-26 includes, wherein the instructions do not operate to decrement the LBA region counter.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. Unless otherwise clearly indicated by express language or context, MLC is used herein in its broader context, to refer to memory cells that can store more than one bit of data per cell (i.e., that can represent more than two programmed states).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:
receiving a trim command for a partition of a flash storage system;
identifying a record of a partition table of the flash storage system corresponding to the partition;
updating a partition count of the record with a count value of a partition counter of the flash storage system; and
incrementing the partition counter.

2. The method of claim 1, wherein identifying the record includes retrieving the record from a single-level-cell (SLC) memory of the flash storage system.

3. The method of claim 2, wherein updating a partition count of the record with a count value of a partition counter of the flash storage system includes writing the partition table to the SLC memory after incrementing the partition counter; and
wherein incrementing the partition counter includes storing a value of the partition counter in the SLC memory.

4. The method of claim 1, including:
receiving a write command at a controller of the flash storage system, the write command including a logical block address (LBA) and write data;
identifying a physical address (PA) corresponding to the LBA using at east a portion of a logical-to-physical (L2P) table and the LBA;
identifying a partition associated with the PA and a partition count associated with the partition using the partition table;
generating metadata including the partition count;
storing the metadata; and
writing the write data at the PA of the flash storage system.

5. The method of claim 4, wherein storing the metadata and writing the write data includes storing the metadata with the write data.

6. The claim 4, wherein storing the metadata include storing the r in the L2P table.

7. The method of claim 1, including:
receiving a read command at a controller of the flash storage system, the read command including a logical block address (LISA);
identifying a physical address (PA) corresponding to the LISA using at least a portion of a logical-to-physical (L2P) table and the LBA;
reading data from the flash storage system using the PA;
identifying a target partition count associated with the data;
identifying a partition count associated with the partition using the partition table;
comparing the partition count with the target partition count;
when the partition count does not match the target partition count, setting read data to a default value indicative of invalid data; and
providing the read data in response to the read command.

8. The method of claim 7, including, when the partition count matches the target partition count, providing the read data in response to the read command.

9. The method of claim 1, including conducting garbage collection of the partition during idle times of the flash storage system after incrementing the partition counter.

10. A storage system comprising:
flash memory; and
a controller configured to:
receive a trim command for a partition of a flash storage system identify a record of a partition table of the flash storage system corresponding to the partition;
update a partition count of the record with a count value of a partition counter of the flash storage system; and
increment the partition counter.

11. The storage system of claim 10, wherein the controller, when identifying the record of the partition table, is configured to retrieve the record from single-level-cell (SLC) memory of the flash storage system.

12. The storage system of claim 11, wherein the controller is configured to write the record to the SLC memory after incrementing the partition counter.

13. The storage system of claim 10, wherein the controller is configured to:
receive a write command, the write command including a logical block address (LBA) and write data;
identify a physical address (PA) corresponding to the LBA using at least a portion of a logical-to-physical (L2P) table and the LBA;
identify a partition associated with the PA;
identify a partition count associated with the partition using, the partition table;
generate metadata including the partition count;
store the metadata; and
write the write data to the flash memory indexed by the PA.

14. The storage system of claim 13, wherein the controller is configured to store the metadata in the L2P table.

15. The storage system of claim 13, wherein the controller is configured to store the metadata to the flash memory indexed by the PA with the write data.

16. The storage system of claim 10, wherein the controller is configured to:
receive a read command, the read command including a logical block address (LBA);
identify a physical address (PA) corresponding to the LBA using at least a portion of a logical-to-physical (L2P) table of the flash storage system and the LBA;
identify metadata including a target partition count associated with the PA;
identify a partition associated with the PA using the metadata;
identify a partition count associated with the partition using the partition table;
compare the partition count with the target partition count;
when the partition count does not match the target partition count, set read data to a default value indicative of invalid data; and
provide the read data in response to the read command.

17. The storage system of claim 16, wherein the controller is configured to sense the read data from the flash memory indexed by the PA to identify the metadata.

18. The storage system of claim 16, wherein, when the partition count matches the target partition count, the controller is configured to provide the read data in response to the read command.

19. The storage system of claim 10, wherein the controller is configured to conduct garbage collection of the partition during idle times of the flash storage system after incrementing the partition counter.

20. A machine-readable medium including instructions for un-mapping logical units of flash memory, the instructions, when executed by processing circuitry, cause the processing circuitry to perform operations comprising:
receiving a trim command for a LBA region of a flash storage system;
identifying a record of a LBA region table of the flash storage system corresponding to the LBA region;

updating a LBA region count of the record with a count value of a LBA region cow of the flash storage system; and incrementing the LBA region counter.

21. The machine-readable medium of claim 20, wherein, when identifying the record of the LBA region table, the operations include retrieving the record from single-level-cell (SLC) memory of the flash storage system.

22. The machine-readable medium of claim 20, wherein the instructions include writing the record to the SLC memory after incrementing the LBA region counter.

23. The machine-readable medium of claim 20, wherein the instructions further comprise:
   receiving a write command at a controller of the flash storage system, the write command including a logical block address (LBA) and write data;
   identifying a physical address (PA) corresponding to the LBA using at least a portion of a logical-to-physical (L2P) table and the LBA; and
   identifying a LBA region associated with the PA and a LBA region count associated with the LBA region using the LBA region table.

24. The machine-readable medium of claim 20, wherein the instructions further comprise:
   receiving a read command at a controller of the flash storage system, the read command including a logical block address (LBA);
   identifying a physical address (PA) corresponding to the LBA using at least a portion of a logical-to-physical (L2P) table and the LBA;
   reading data from the flash storage system using the PA;
   identifying a target LBA region count associated with the data;
   identifying a LBA region count associated with the LBA region using the LBA region table;
   comparing the LBA region count with the target LBA region count;
   when the LBA region count does not match the target LBA region count, setting read data to a default value indicative of invalid data; and
   providing the read data in response to the read command.

25. The machine-readable medium of claim 24, wherein the operations further comprise:
   when the LBA region count matches the target LBA region count, sensing read data from e PA; and
   providing the read data in response to the read command.

26. The machine-readable medium of claim 20, wherein the operations further comprise conducting garbage collection of the LBA region during idle times of the flash storage system after incrementing the LBA region counter.

27. The machine-readable medium of claim 20, wherein the instructions do not operate to decrement the LBA region counter.

* * * * *